United States Patent [19]

Sumi

[11] Patent Number: 4,872,143
[45] Date of Patent: Oct. 3, 1989

[54] PSEUDO STATIC RANDOM ACCESS MEMORY EMPLOYING DYNAMIC MEMORY CELLS

[75] Inventor: Tadashi Sumi, Hyogo, Japan

[73] Assignee: Mitsubishi Denki Kabushiki Kaisha, Tokyo, Japan

[21] Appl. No.: 120,425

[22] Filed: Nov. 13, 1987

[30] Foreign Application Priority Data

Nov. 14, 1986 [JP] Japan .................................. 61-272145

[51] Int. Cl.$^4$ ............................................. G11C 8/00
[52] U.S. Cl. ................................. 365/233.5; 365/194;
365/195
[58] Field of Search ............... 365/189, 230, 233, 194,
365/195, 233.5, 194, 195

[56] References Cited

U.S. PATENT DOCUMENTS 4,581,718  4/1986  Oishi .................................... 365/230
4,660,180  4/1987  Tanimura et al. .................... 365/189

OTHER PUBLICATIONS

*ISSCC*, 1986 IEEE, "Session XVII: Logic Arrays and Memories", by Takayuki Sakurai et al, Feb. 21, 1986, pp. 252-253.

*Primary Examiner*—James W. Moffitt
*Attorney, Agent, or Firm*—Lowe, Price, LeBlanc, Becker & Shur

[57] ABSTRACT

A pseudo static RAM includes an array of dynamic memory cells and peripheral circuits such as precharge transistors, a row decoder and sense amplifiers. Address change detecting circuits detect address signal change. A pulse generator supplies a pulse signal to a timing generator and a busy signal generator in response to the address signal change. The timing generator generates various timing signals for driving the peripheral circuits. When a subsequent address signal change is detected during operation of a dynamic RAM, a flag circuit generates a flag signal in response to a subsequent pulse signal from the pulse generator and a busy signal from the busy signal generator. Thus, the signal commanding such subsequent operation of the pseudo static RAM is stored in the form of a flag signal until the first operation is completed. Upon completion of first operation of the dynamic RAM, subsequent operation is started on the basis of the flag signal.

7 Claims, 5 Drawing Sheets

PSEUDO STATIC RANDOM ACCESS MEMORY EMPLOYING DYNAMIC MEMORY CELLS

BACKGROUND OF THE INVENTION

1. Field of the Invention

The present invention relates to a pseudo static RAM (random access memory), (RAM), and more specifically, it relates to an improvement in a pseudo static RAM including a dynamic memory cell array and peripheral circuits whose internal operation is controlled in response to change in address signal.

2. Description of the Prior Art

Conventional semiconductor RAMs are roughly classified into a static RAMs and a dynamic RAMs.

In basic structure, the static RAM employs flip-flop circuits as memory cells. The flip-flop circuits employed in the static RAM are in static circuit structure, and hence no stored data will be lost so long as power is applied to the same. Due to such stability in storage, the static RAM is mainly designed in view of facility. In further detail, the static RAM generally requires no external clock. Namely, a desired address can be accessed by simply applying combination of a plurality of signal levels of address signals.

On the other hand, the dynamic RAM employs capacitors as memory cells in basic structure. Namely, the dynamic RAM requires complicated peripheral circuits such as refresh circuits, in order to store information of "0" and "1" depending on whether or not the capacitors store charges. Thus, complicated internal operation of the peripheral circuits is required to access the memory cells of the dynamic RAM, and external clocks are generally required in order to control the internal operation. As compared with the memory cells of the static RAM formed by flip-flops, the memory cells of the dynamic RAM are formed by capacitors of simpler structure and smaller size. Thus, the dynamic RAM can be fabricated in a smaller chip area at a lower cost than the static RAM, to attain the same storage capacity.

As hereinabove described, the static RAM and the dynamic RAM are opposite to each other in that the static RAM is easy to control but high-priced while the dynamic RAM is low-priced but difficult to control.

In recent years, advantages of the static RAM and the dynamic RAM are simultaneously implemented by a semiconductor RAM which is virtually formed by a static RAM but internally structured by a dynamic RAM. Such a semiconductor RAM has pin arrangement and a signal system which are identical to those of the static RAM and employs no external clock similarly to the static RAM, while memory cells thereof are formed by capacitors similarly to the dynamic RAM, to internally utilize clocks. Such an intermediate type RAM is generally called a pseudo static RAM, and disclosed in "A 1 Mb Virtually SRAM" by Sakurai et al., IEEE International Solid-State Circuits Conference, Feb. 21, 1986, pp. 252-253, for example. In such a pseudo static RAM, no clock is present in the signal system of the static RAM and the memory cells are selected in accordance with combination of high and low levels of address signals. Namely, subsequent access is started upon change of the combination. In this case, at least one of a plurality of address signals changes from "H" to "L" or vice versa, and such change is detected so that a pulse is generated to be supplied as a clock required for internal operation of the dynamic RAM.

FIG. 1 is a block diagram showing an example of such a conventional pseudo static RAM. Referring to FIG. 1, memory cells $7_1$ to $7_n$, sense amplifiers $9_1$ to $9_n$, a row decoder 5 and a column decoder 10 correspond to basic structure of a general dynamic RAM.

In further detail, each of the memory cells $7_1$ to $7_n$ is formed by a dynamic memory cell having a single capacitor and a single transistor. A first electrode of each capacitor is grounded and a second electrode is connected to a first conducting terminal of the transistor. Second conducting terminals of the transistors of the memory cells $7_1$ to $7_n$ are connected to bit lines $BL_1$ to $BL_n$ respectively, while control terminals of the transistors are connected to a word line WL. The word lines WL are connected to the row decoder 5, and a dummy word line DWL is connected to a dummy decoder 6. Numerals $8_1$ to $8_n$ indicate parasitic capacitances of the bit lines $BL_1$ to $BL_n$ respectively. Each of the bit lines $BL_1$ to $BL_n$ is connected to a power source $V_{CC}$ through a precharge transistor which is on-off controlled by a signal $\phi_P$ as hereinafter described. The bit lines $BL_1$ to $BL_n$ are also connected to sense amplifiers $9_1$ to $9_n$. The column decoder 10 selects one of signals amplified by the sense amplifiers $9_1$ to $9_n$, to output the same through an output circuit 12 and an output terminal 13.

The pseudo static RAM as shown in FIG. 1 is different from a general dynamic RAM in the following points: Address change detecting circuits $2_1$ to $2_n$ are connected to address signal input terminals $1_1$ to $1_n$ respectively. The address change detecting circuits $2_1$ to $2_n$ directly supply address signal levels applied through the input terminals $1_1$ to $1_n$ to the row decoder 5, while detecting change in address signal level from "H" to "L" or from "L" to "H" to inform a pulse generator 3 of such change. The pulse generator 3 responsively generates a pulse $\phi_D$ as hereinafter described, to supply the same to a timing generator 4. On the basis of the pulse $\phi_D$, the timing generator 4 generates various timing signals as hereinafter described.

FIG. 2 is a waveform diagram for illustrating the operation of the conventional pseudo static RAM as shown in FIG. 1.

Referring to FIGS. 1 and 2, row address signals are first supplied to the address change detecting circuits $2_1$ to $2_n$ through the input terminals $1_1$ to $1_n$. When one of the row address signals thus applied changes as shown at FIG. 2(a), corresponding one of the address change detecting circuits $2_1$ to $2_n$ detects the change to inform the pulse generator 3 of the same by a signal. Upon detection of such level change of one of the plurality of row address signals, the pulse generator 3 generates a pulse $\phi_D$ as shown at FIG. 2(b), to supply the same to the timing generator 4. While a general dynamic RAM supplies a clock corresponding to the pulse $\phi_D$ from the exterior, the pseudo static RAM as shown in FIG. 1 is extremely different from such a general dynamic RAM in that the pulse $\phi_D$ corresponding to the clock is generated within the chip on the basis of the address signal change.

On the basis of the pulse $\phi_D$, the timing generator 4 outputs various timing signals for internal operation of the dynamic RAM.

First, a signal $\phi_P$ at FIG. 2(e) falls from "H" to "L" in response to the pulse $\phi_D$, whereby the precharge transistors for the bit lines $BL_1$ to $BL_n$ are turned off. Thus, the bit lines $BL_1$ to $BL_n$ are cut off from the power sources $V_{CC}$ in precharged states, to be in preparation for receiving data from the memory cells $7_1$ to $7_n$. Then a signal $\phi_{WL}$ as shown at FIG. 2(c) rises from "L" to "H", and the row decoder 5 responsively converts levels of the word lines WL from "L" to "H". Thus, the respective transistors of the memory cells $7_1$ to $7_n$ conduct so that the capacitors of the memory cells $7_1$ to $7_n$ are connected to the bit lines $BL_1$ to $BL_n$ respectively. Namely, when storage contents of the memory cells $7_1$ to $7_n$ are "H" as shown at FIG. 2(f), voltage levels of the bit lines $BL_1$ to $BL_n$ directly go high as shown at FIG. 2(g), while the voltage levels are slightly lower than the "H" levels as shown at FIG. 2(g) when the storage contents are "L" as shown at FIG. 2(f). Such voltage drop, the value of which is about 200 mV in general, is determined by the ratio of the parasitic capacitances $8_1$ to $8_n$ of the bit lines $BL_1$ to $BL_n$ to capacitances of the memory cells $7_1$ to $7_n$. At this time, the voltage levels of the memory cells $7_1$ to $7_n$ are identical to those of the bit lines $BL_1$ to $BL_n$, as shown at FIGS. 2(f) and (g).

Then, a signal $\phi_{SA}$ as shown at FIG. 2(d) rises from "L" to "H", whereby the sense amplifiers $9_1$ to $9_n$ operate to amplify the aforementioned potential difference of 200 mV, thereby to retain the "H" levels of the bit line potentials and correct the incomplete "L" level, being lower by 200 mV than the "H" level, to a complete "L" level, as shown at FIG. 2(g).

It is to be noted here that the voltage levels of the data "L" in the memory cells $7_1$ to $7_n$ are extremely high as shown at FIG. 2(f) within the period in which the word lines WL go high in response to the signal $\phi_{WL}$ so that the data of the memory cells $7_1$ to $7_n$ are read on the bit lines $BL_1$ to $BL_n$, to be amplified by the sense amplifiers $9_1$ to $9_n$ in response to the signal $\phi_{SA}$. Namely, the data of the memory cells $7_1$ to $7_n$ are temporarily destroyed, i.e., the same are in the so-called destructive read state in this period.

Then, the column decoder 10 selects one of the signals amplified by the sense amplifiers $9_1$ to $9_n$ to supply the same to the output circuit 12, in response to column address signals supplied to input terminals $11_1$ to $11_n$. The output circuit 12 outputs the signal of FIG. 2(h) through the output terminal 13.

In the aforementioned conventional pseudo static RAM, consideration must be given to constraints specific to the static RAM. As hereinabove described, the data of the memory cells are temporarily destroyed within a period during operation of the dynamic RAM. Therefore, if the operation is aborted in such a destructive period, the data of the memory cells remained destroyed. Thus, operation, once started, must never be aborted until amplification by the sense amplifiers is completed. Consequently, the width of external clocks is strictly defined in a general dynamic RAM, and such defined width must be absolutely kept in employment of the RAM.

However, the static RAM has rather loose constraints relating to address signals such that, when internal clocks for the dynamic RAM are produced on the basis of address signal change as hereinabove described, the clocks do not satisfy the aforementioned strictly defined width required for the dynamic RAM, and therefore the data of the memory cells may be destroyed.

FIG. 3 is a waveform diagram showing examples of loosely constrained address signals specific to the static RAM. Referring to FIG. 3(a), there is a lag between two sorts of address signals $A_1$ and $A_2$. Namely, if an internal clock for starting new operation is generated by change in the address signal $A_2$ when preceding internal operation is being executed by an internal clock generated by change in the address signal $A_1$, the preceding internal operation is aborted. FIG. 3(b) shows an address signal which changes in short cycles. Also in this case, preceding internal operation performed by first signal change is aborted halfway by an internal clock generated by second signal change. In the case of FIG. 3(c), an address signal includes noise N. The address change detecting circuits $2_1$ to $2_n$ as shown in FIG. 1 detect such noise N as signal change, leading to a similar result. Such examples (a) to (c) may always take place in actual employment of the static RAM, and hence a pseudo static RAM must be structured so that no malfunction is caused by such address signal change. In view of such a problem, the pseudo static RAM in the aforementioned literature inhibits internal operation in a period of 15 ns from detection of address signal change to prevent a malfunction caused by a small address skew, whereas a malfunction caused by a large skew or noise cannot be prevented by such a method.

SUMMARY OF THE INVENTION

Accordingly, a principal object of the present invention is to provide a pseudo static RAM which performs stable operation in case of loosely constrained address signals specific to a static RAM.

Briefly stated, the present invention provides a semiconductor RAM which comprises an array of a plurality of dynamic memory cells and peripheral circuits thereof and detects address signal change to generate timing signals for controlling internal operation of the peripheral circuits. When an address signal continuously changes within a prescribed period for executing internal operation, subsequent address signal change is temporarily stored until internal operation by first address signal change is completed, to start internal operation by the stored subsequent address signal change upon completion of the internal operation by the first address signal change.

A principal advantage of the present invention is that, when an operation command is issued by subsequent address signal change during preceding internal operation of the peripheral circuits by first address signal change, the said operation command is temporarily stored to start subsequent operation upon completion of the preceding operation, so that no malfunction takes place to abort the first internal operation by the subsequent operation command, whereby destruction of the data of the memory cells are prevented.

These and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
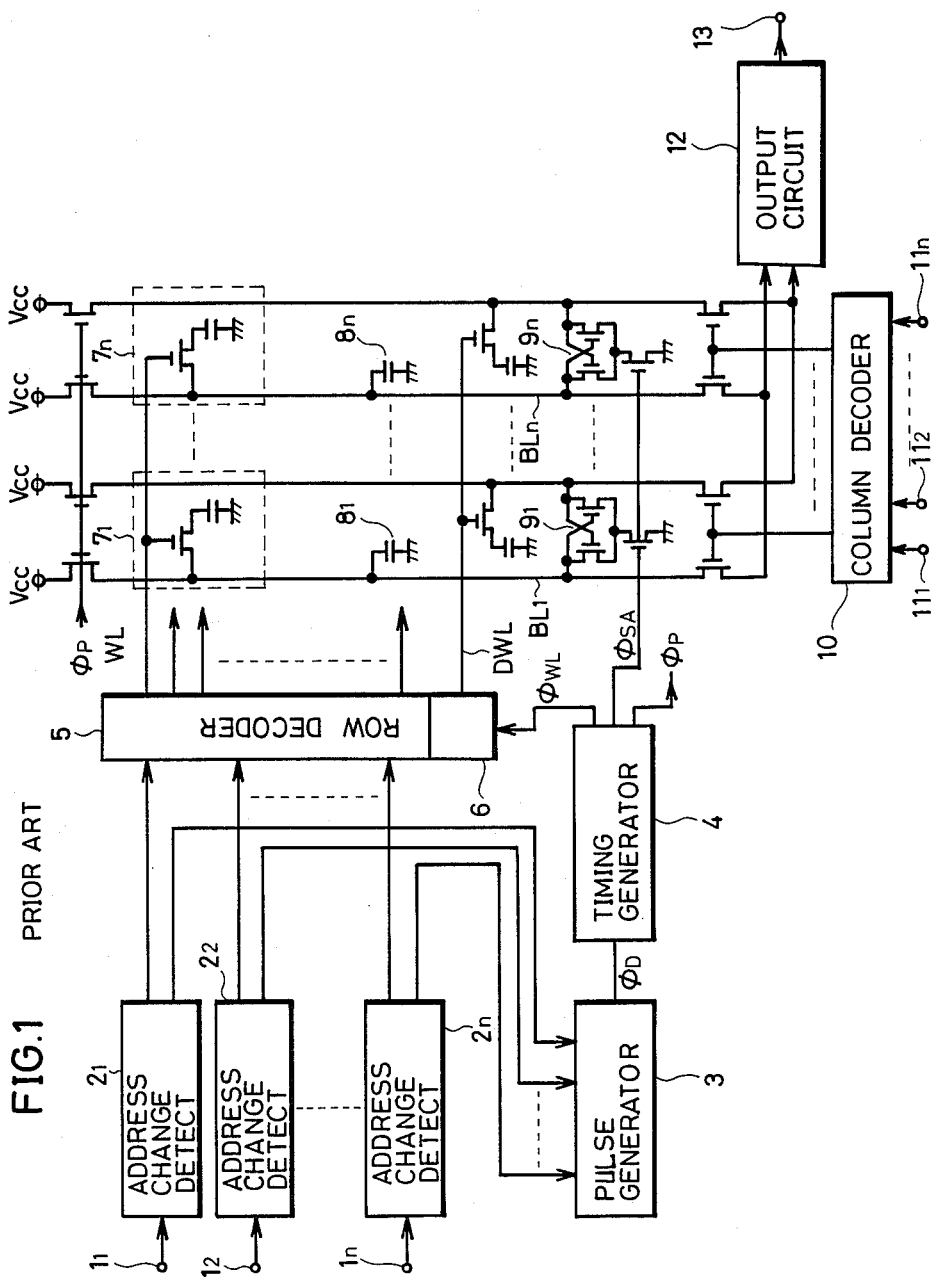
FIG. 1 is a block diagram showing an example of a conventional pseudo static RAM.
Figure 4:
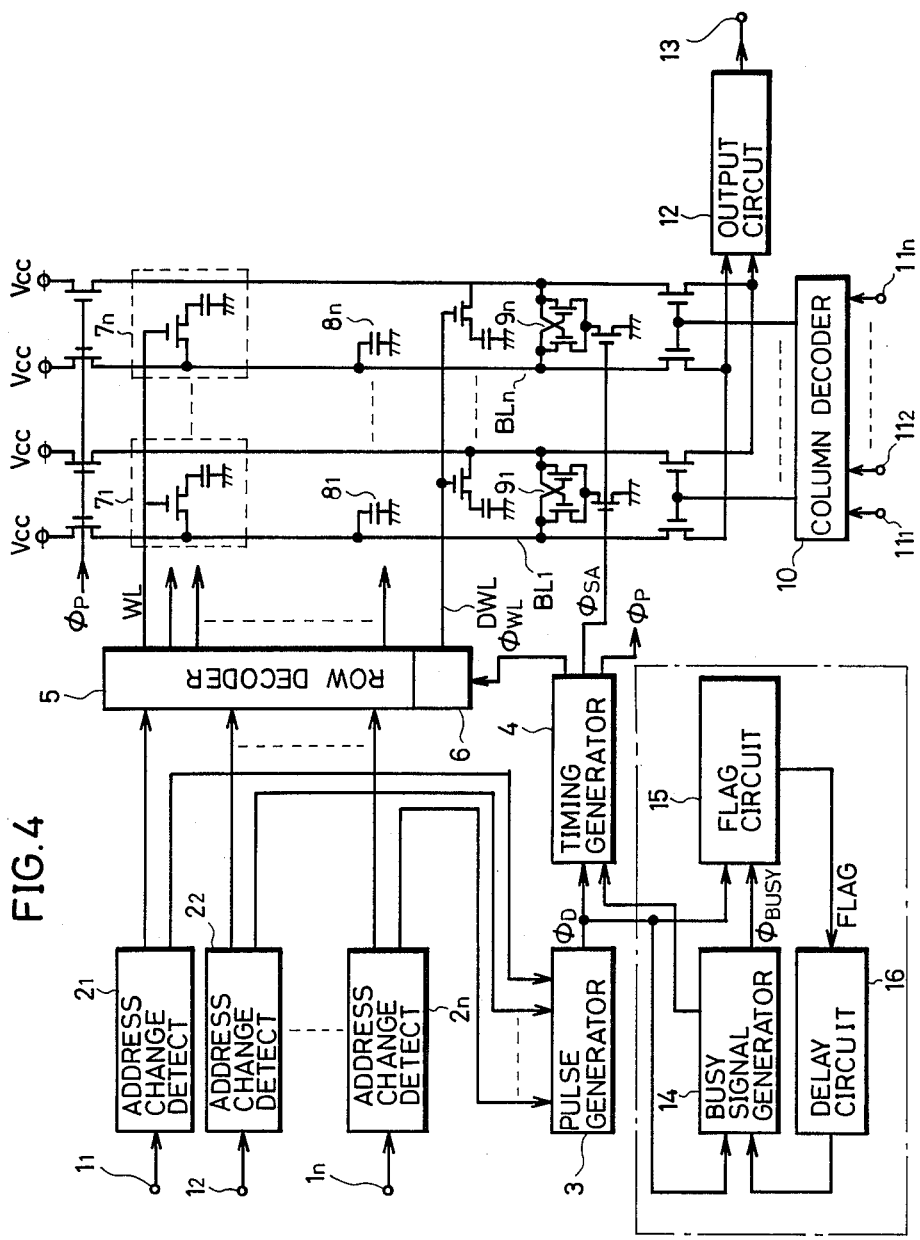
FIG. 4 is a block diagram showing a pseudo static RAM according to an embodiment of the present invention.

FIG. 4 is a block diagram showing a pseudo static RAM according to an embodiment of the present invention. The embodiment of FIG. 4 is identical to the conventional pseudo static RAM as shown in FIG. 1, except for addition of a part enclosed by one-dot chain lines.

In further detail, such an added part is provided with a busy signal generator 14 which generates a signal $\phi_{BUSY}$ indicating that a dynamic RAM is in an internal operation state in response to a pulse $\phi_D$ supplied from a pulse generator 3, a flag circuit 15 which generates a flag signal indicating that a subsequent signal is accepted during operation of the RAM in response to the pulse $\phi_D$ and the signal $\phi_{BUSY}$ and a delay circuit 16 which controls timing of the flag signal to supply the same to the busy signal generator 14.

Figure 5:
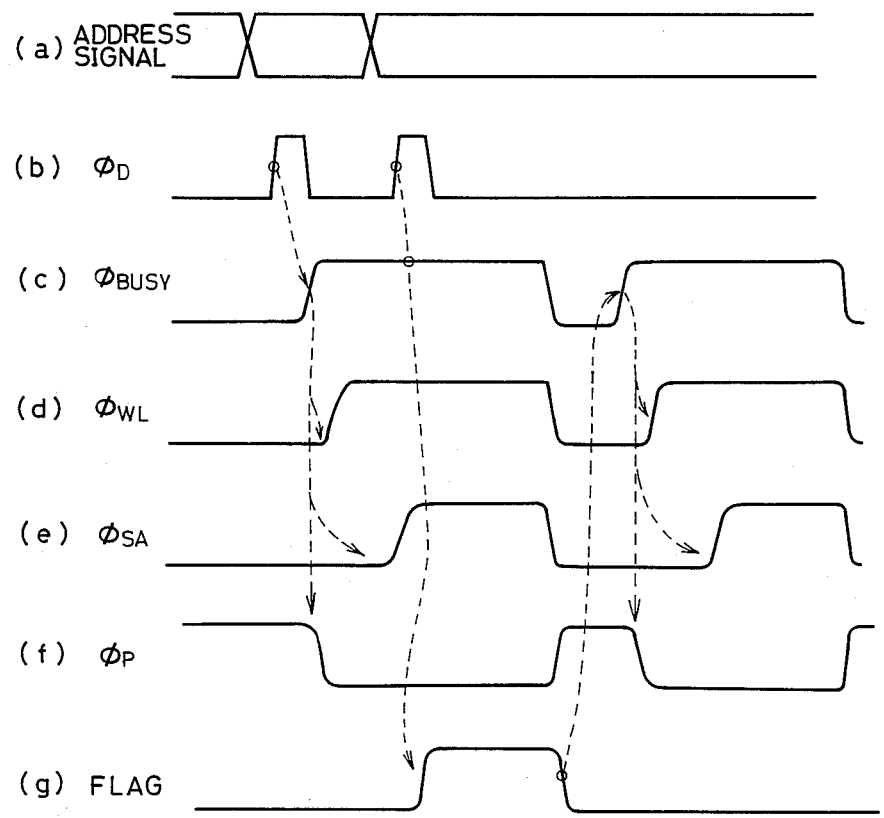
FIG. 5 is a waveform diagram for illustrating the operation of the embodiment as shown in FIG. 4.

FIG. 5 is a waveform diagram for illustrating the operation of the embodiment as shown in FIG. 4.

With reference to FIGS. 4 and 5, description is now made on the operation of the pseudo static RAM according to the embodiment of the present invention.

Figure 2:
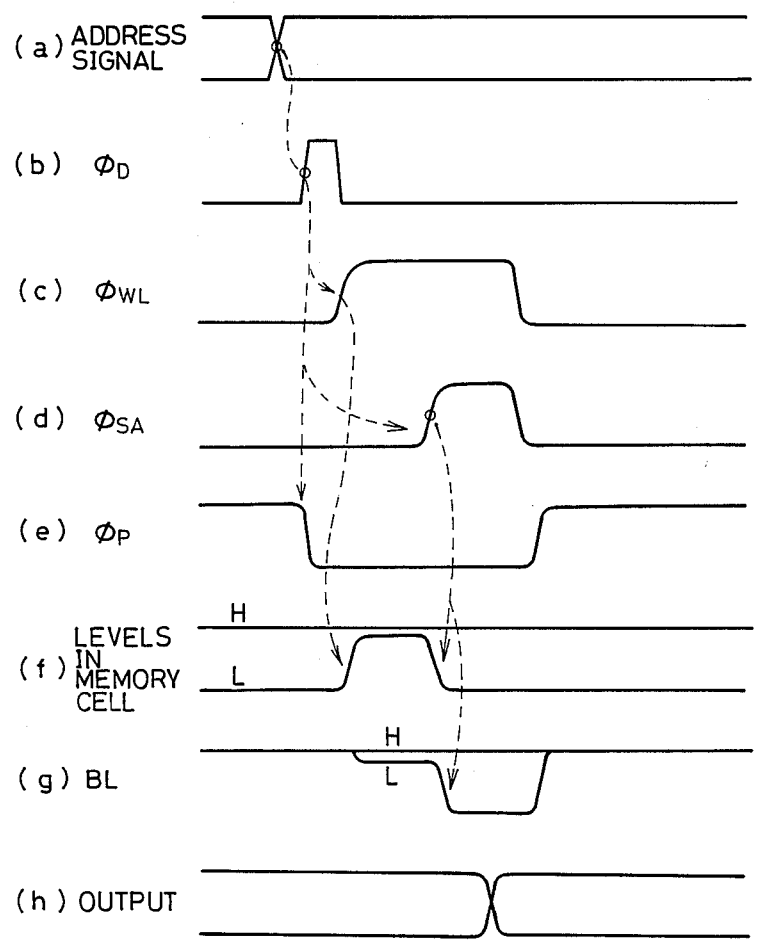
FIG. 2 is a waveform diagram for illustrating the operation of the pseudo static RAM as shown in FIG. 1.
Figure 3:
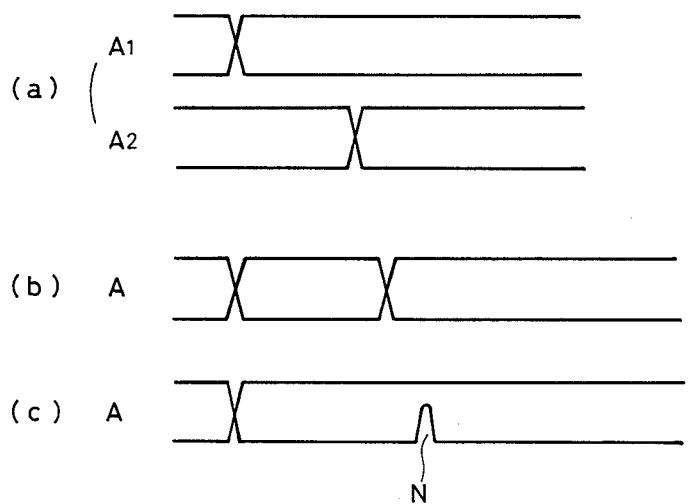
FIG. 3 is a waveform diagram showing examples of loosely constrained address signals specific to a static RAM.

First, row address signals are supplied to address change detecting circuits $2_1$ to $2_n$ through input terminals $1_1$ to $1_n$. Assuming that one of the row address signals thus applied continuously changes in short time intervals as shown at FIG. 5(a), corresponding one of the address change detecting circuits $2_1$ to $2_n$ detects first address change, to inform the pulse generator 3 of such change by a signal. The pulse generator 3 responsively generates the first one of pulse signals $\phi_D$ as shown at FIG. 5(b), to supply the same to the timing generator 4. On the basis of the pulse $\phi_D$, the timing generator 4 outputs various timing signals, i.e., signals $\phi_P$ (FIG. 5(f)), $\phi_{WL}$ (FIG. 5(d)) and $\phi_{SA}$ (FIG. 5(e)), which are identical to those of the conventional RAM as shown in FIG. 2. Namely, the signal $\phi_P$ falls from "H" to "L", so that precharge transistors for bit lines $BL_1$ to $BL_n$ are turned off. Thus, the bit lines $BL_1$ to $BL_n$ are cut off from power sources $V_{CC}$ in precharged states in preparation for receiving data from memory cells $7_1$ to $7_n$. Then, the signal $\phi_{WL}$ as shown at FIG. 5(d) rises from "L" to "H", and a row decoder 5 responsively converts levels of word lines WL from "L" to "H". Thus, respective transistors of the memory cells $7_1$ to $7_n$ conduct so that capacitors of the memory cells $7_1$ to $7_n$ are connected on the bit lines $BL_1$ to $BL_n$. Then, the signal $\phi_{SA}$ as shown at FIG. 5(e) rises from "L" to "H", to drive sense amplifiers $9_1$ to $9_n$. Thereafter a column decoder 10 selects one of signals amplified by the sense amplifiers $9_1$ to $9_n$ in response to column address signals received in input terminals $11_1$ to $11_n$, to supply the same to an output circuit 12. The output circuit 12 supplies an output signal through an output terminal 13.

On the other hand, the first pulse $\phi_D$ outputted from the pulse generator 3 is also supplied to the busy signal generator 14, which generates a signal $\phi_{BUSY}$ as shown at FIG. 5(c) in response to the pulse $\phi_D$. This signal $\phi_{BUSY}$ indicates the operating state of the dynamic RAM, and is defined to retain an "H" level until the operation of the sense amplifiers $9_1$ to $9_n$ is completed once the same goes high.

Description is now made on such case where subsequent address signal change as shown at FIG. 5(a) is detected by a corresponding address change detecting circuit during an operating period of the dynamic RAM by the first address signal change. In this case, the "H" level signal $\phi_{BUSY}$ is applied from the busy signal generator 14 to the flag circuit 15, and a subsequent pulse $\phi_D$ is also applied from the pulse generator 3. The flag circuit 15 generates a flag signal as shown at FIG. 5(g), on the basis of the supplied "H" level signal $\phi_{BUSY}$ (FIG. 5(c)) and the subsequent pulse $\phi_D$ (FIG. 5(b)). This flag signal indicates that a subsequent operation start command is accepted during the operating period of the dynamic RAM by the first operation command.

Then, when the operation of the dynamic RAM by the first address signal change is completed, the signals $\phi_{BUSY}$ (FIG. 5(c)), $\phi_{WL}$ (FIG. 5(d)) and $\phi_{SA}$ (FIG. 5(e)) are reset to "L" levels and the signal $\phi_P$ (FIG. 5(f)) is reset to an "H" level. Further, the flag signal is also reset to an "L" level as shown at FIG. 5(g), while such fall timing is delayed by a prescribed period by a delay circuit 16, to be supplied to the busy signal generator 14 and the timing generator 4. The timing generator 4 responsively makes the signal $\phi_{BUSY}$ go high, to inform of re-starting of operation of the dynamic RAM. The timing generator 4 responsively generates the signals $\phi_P$, $\phi_{WL}$ and $\phi_{SA}$, to re-start the operation of the dynamic RAM. The delay circuit 16 is provided in order to secure an "H" level period of the signal $\phi_P$ (FIG. 5(f)), thereby to ensure resetting of the dynamic RAM.

While one of the address signals changes in short time intervals at FIG. 5(a), absolutely identical operation is performed also in case where there are lags in change timing between a plurality of address signals or the address signals include noise.

Namely, when an operation command $\phi_d$ by subsequent address signal change is applied during an "H" level period of the signal $\phi_{BUSY}$, i.e., before preceding internal operation of the dynamic RAM by first address signal change is completed, the command $\phi_d$ is temporarily stored in the form of a flag signal so that subsequent operation is started on the basis of the flag signal thus stored upon completion of the preceding operation, whereby the first internal operation under execution is never aborted by the subsequent operation command. Thus, the data of the dynamic memory cells are prevented from destruction even if the same are controlled by loosely constrained address signals, which are specific to the static RAM.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory comprising:
an array formed by a plurality of dynamic memory cells;
peripheral circuit means for executing internal operation for writing/reading data in/from said memory cells within a prescribed period;
means for supplying an address signal for writing/reading said data in/from each of said memory cells;
means for detecting change in said address signal;

means for generating timing signals for controlling said internal operation of said peripheral circuit means in response to said detected address signal change; and means for temporarily storing a subsequent address signal change until completion of preceding internal operation of said peripheral circuit means responsive to first address signal change when said address signal continuously changes in said prescribed period and for supplying said stored subsequent address signal change to said timing signal generation means upon completion of said preceding internal operation of said peripheral circuit means responsive to said first address signal change.

2. A semiconductor memory in accordance with claim 1, wherein said means for temporarily storing said subsequent address signal change and supplying the same to said timing signal generation means includes:

means for generating a busy signal having a duration corresponding to said prescribed period in response to detected first address signal change, and means for generating a flag signal being sustained till completion of said prescribed period in response to detected subsequent address signal change and said busy signal, said timing signal generation means generating said timing signals in response to termination of said flag signal.

3. A semiconductor memory in accordance with claim 2, further including means for delaying said flag signal to supply the same to said timing signal generation means.

4. A semiconductor memory in accordance with claim 3, wherein said array further includes:

a plurality of bit lines, and a plurality of word lines being orthogonal to said bit lines, said plurality of memory cells being arranged in intersections between said bit lines and said word lines respectively, each said memory cell including:

a capacitor having a grounded first electrode, and a transistor having a first conducting terminal connected to a second electrode of said capacitor, a second conducting terminal connected to said bit line and a control terminal connected to said word line.

5. A semiconductor memory in accordance with claim 4, wherein said peripheral circuit means includes:

power sources for precharging said plurality of bit lines, and means for connecting said power sources to said plurality of bit lines, said timing signal generation means generating a first timing signal for controlling said connecting means to cut off said bit lines from said power sources in response to said detected address signal change.

6. A semiconductor memory in accordance with claim 5, wherein said peripheral circuit means includes decoder means for selecting one of said plurality of word lines on the basis of said address signal supplied from said address signal supply means to change the level on said selected word line thereby to allow conduction of said transistor of said memory cell connected to said word line, said timing signal generation means generating a second timing signal for driving said decoder means in response to said detected address signal change.

7. A semiconductor memory in accordance with claim 6, wherein said peripheral circuit means includes sense amplifier means for amplifying data read out on said bit lines from said memory cells through said transistors in response to said second timing signal, said timing signal generation means generating a third timing signal for driving said sense amplifier means in response to said detected address signal change.

* * * * *